United States Patent
Kim et al.

(10) Patent No.: US 8,654,055 B2
(45) Date of Patent: Feb. 18, 2014

(54) GATE DRIVING CIRCUIT AND DISPLAY DEVICE HAVING THE GATE DRIVING CIRCUIT

(75) Inventors: Hak-Gyu Kim, Yongin-si (KR); Young-Joo Park, Hwaseong-si (KR); Ji-Suk Lim, Daejeon (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 870 days.

(21) Appl. No.: 12/539,095

(22) Filed: Aug. 11, 2009

(65) Prior Publication Data
US 2010/0164915 A1 Jul. 1, 2010

(30) Foreign Application Priority Data
Dec. 29, 2008 (KR) .................................. 2008-135415

(51) Int. Cl.
*G09G 3/36* (2006.01)

(52) U.S. Cl.
USPC ........................................... 345/98; 345/100

(58) Field of Classification Search
USPC .................................................. 345/98, 100
See application file for complete search history.

(56) References Cited

U.S. PATENT DOCUMENTS

| | | | |
|---|---|---|---|
| 5,202,908 A * | 4/1993 | Hatada | 377/64 |
| 6,239,779 B1 * | 5/2001 | Furuya et al. | 345/96 |
| 2003/0058234 A1 * | 3/2003 | Kanzaki et al. | 345/211 |
| 2003/0227433 A1 * | 12/2003 | Moon | 345/100 |
| 2006/0187175 A1 | 8/2006 | Lo et al. | |
| 2006/0232543 A1 * | 10/2006 | Kobayashi et al. | 345/100 |
| 2008/0088555 A1 * | 4/2008 | Shin et al. | 345/98 |

FOREIGN PATENT DOCUMENTS

| | | |
|---|---|---|
| JP | 2008-020675 | 1/2008 |
| KR | 1020060104814 | 10/2006 |
| KR | 1020070042334 | 4/2007 |
| KR | 1020080049899 | 6/2008 |

* cited by examiner

*Primary Examiner* — Kevin M Nguyen
(74) *Attorney, Agent, or Firm* — F. Chau & Associates, LLC (57) ABSTRACT

A gate driving circuit includes a first shift register and a second shift register for driving odd gate lines. The first shift register includes a first plurality of cascade-connected stages that sequentially output a plurality of first gate signals. A first stage of the first shift register receives a first vertical start signal. The second shift register includes a second plurality of cascade-connected stages to sequentially output a plurality of second gate signals. The first stage of the second shift register receives an output signal of the first stage of the first shift register as its vertical start signal. A data charging rate may be improved by ensuring the timing margin of each gate signal, so that the driving reliability of the gate driving circuit may be improved.

28 Claims, 6 Drawing Sheets

GATE DRIVING CIRCUIT AND DISPLAY DEVICE HAVING THE GATE DRIVING CIRCUIT

PRIORITY STATEMENT

This application claims priority, under 35 U.S.C. §119, of Korean Patent Application No. 2008-135415, filed on Dec. 29, 2008 in the Korean Intellectual Property Office (KIPO), the contents of which are herein incorporated by reference in their entirety.

BACKGROUND OF THE INVENTION

1. Field of the Invention

The present invention relates to a gate driving circuit and a display device having the gate driving circuit. More particularly, the present invention relates to a gate driving circuit that drives a gate line and a display device having the gate driving circuit.

2. Description of the Related Art

Generally, a liquid crystal display (LCD) includes an LCD panel displaying an image by using the light transmissivity of liquid crystal, and a backlight assembly disposed behind the LCD panel to supply light to and through the LCD panel.

The LCD further includes a gate driving circuit connected to a plurality of gate lines and a data driving circuit connected to a plurality of data lines. The plurality of data lines cross the gate lines at the plurality of pixels, each pixel respectively connected to one of the gate lines and to one of the data lines. The gate driving circuit outputs a gate signal to one of the gate lines at a time, and sequentially to all of the gate lines. The data driving circuit outputs a data signal to all of the data lines. The gate driving circuit and the data gate driving circuit are formed in an in integrated circuit, usually formed on a silicon chip, typically mounted on the LCD panel.

Recently, in order to reduce the size of an LCD and to simplify the manufacture of the LCD, a process in which the gate driving circuit is integrated in an amorphous silicon layer deposited on a display substrate has been developed. When the gate driving circuit integrated in the integrated circuit formed on the display substrate is driven in high temperature conditions, visible noise defects such as ripples may be generated during a "gate-OFF signal" period.

Moreover, as LCD panels become dimensionally larger, the resistive and capacitative loads of the lines in the LCD panels are increasing so that resistive-capacitive (RC) delay is increased. However, as the number of gate lines increases with increasing resolution pulse widths of gate signals are decreasing. When pulse widths of gate signals are decreased, the charging time for charging a data voltage on a line is decreased, so that a charging rate of the data voltage may be reduced.

SUMMARY OF THE INVENTION

An aspect of the present invention provides a gate driving circuit capable of improving driving reliability by ensuring the timing margin of a gate signal.

Another aspect of the present invention provides a display device having the above-mentioned gate driving circuit.

Figure 2:
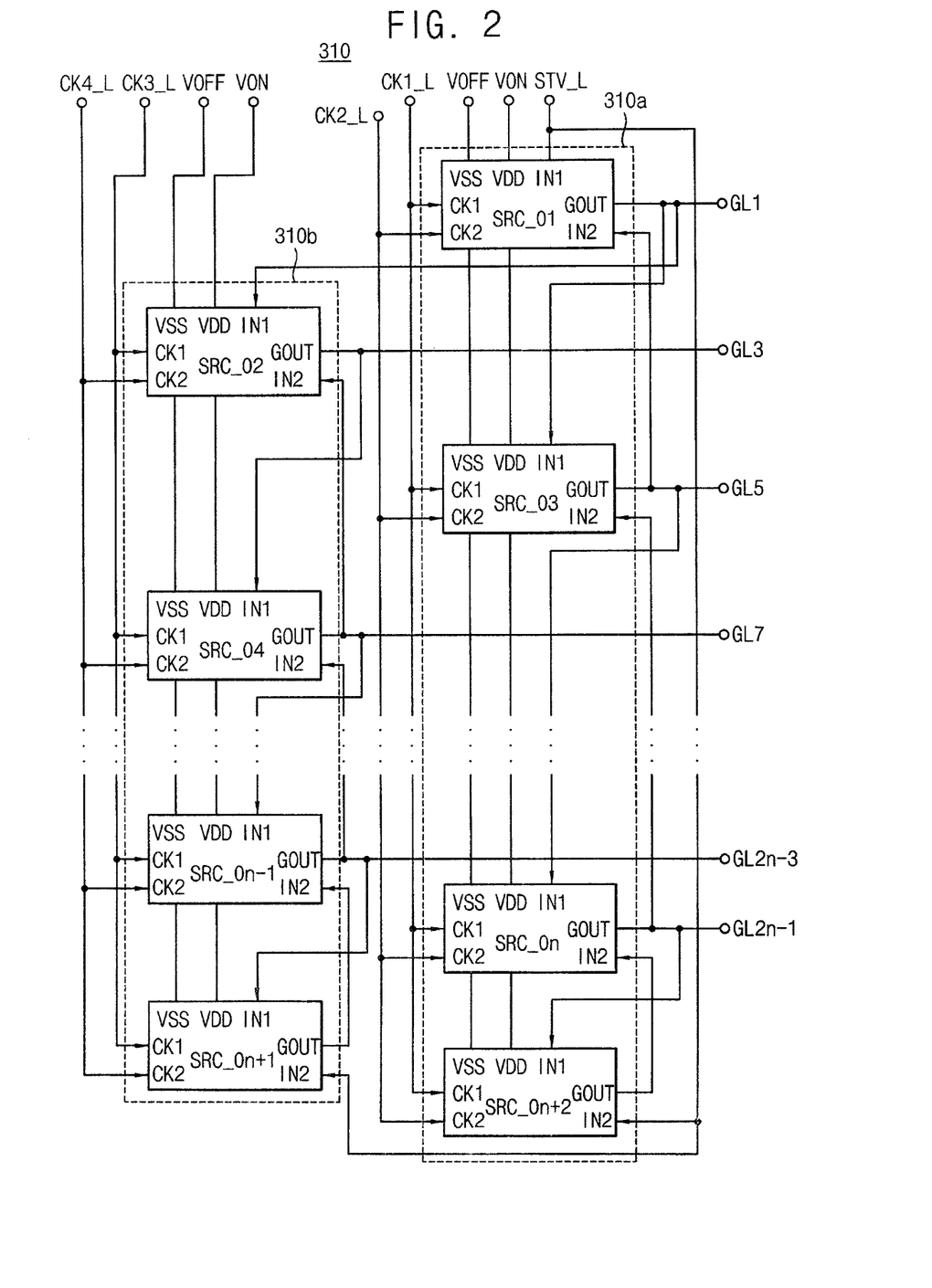
FIG. 2 is a block diagram of the first gate driving circuit 310 in FIG. 1.

According to one aspect of the present invention, a gate driving circuit includes a first shift register (see 310a in FIG. 2) and a second shift register see 310b in FIG. 2) for driving odd gate lines. The first shift register includes a first plurality of stages connected one after another to each other to sequentially output a plurality of first gate signals. The first stage of the first shift register receives a first (primary) vertical start signal (STV_L). The second shift register includes a second plurality of stages connected one after another to each other to sequentially output a plurality of second gate signals. Because the second shift register receives a third clock signal (CK3_L) and a fourth clock signal (CK4_L) that are different from the first clock signal (CK1_L) and the second clock signal (CK2_L) received by the first shift register, the first stage of the second shift register may receives the output signal of the first stage of the first shift register as its start signal (instead of receiving a first delayed vertical start signal equivalent to the first vertical start signal (STV_L) being delayed by 2H ('H' is a horizontal period)).

The second shift register includes a second plurality of stages connected one after another to each other to sequentially output a plurality of second gate signals. The first stage of the second shift register receives an output signal of the first stage of the first shift register as the vertical start signal.

In an exemplary embodiment of the present invention, the output signal of the first stage of the second shift register of a gate driving circuit for driving odd gate lines may be delayed by 2H ('H' is a horizontal period) with respect to an output signal of the first stage of the first shift register of the gate driving circuit for driving odd gate lines.

In an exemplary embodiment of the present invention, the first shift register receives a first clock signal and a second clock signal having a phase opposite to the first clock signal, and the second shift register receives a third clock signal delayed by 2H with respect to the first clock signal and a fourth clock signal having a phase opposite to the third clock signal.

In an exemplary embodiment of the present invention, each of the stages may include a pull-up part, a first pull-up driving part, a first pull-down part and a first ripple preventing part. The pull-up part may output a clock signal as a gate signal to an output terminal in response to a vertical start signal or an output signal of a previous stage. The first pull-up driving unit may turn-off the pull-up part in response to an output signal of a following stage. The first pull-down unit may pull down a voltage of the output terminal to a low level in response to a high level of an inverted clock signal having a phase opposite to the clock signal. The first ripple preventing unit may maintain a voltage applied to a control electrode of the pull-up part at a low level in response to a high level of the inverted clock signal.

According to another aspect of the present invention, a display device includes a display panel, a data driving circuit and a gate driving circuit. The display panel may include a plurality of pixels connected to a plurality of gate lines and a plurality of data lines crossing to each other. The data driving circuit may output a plurality of data signals to the data lines. The gate driving circuit outputting a plurality of gate signals, the gate driving circuit may include a first shift register and a second shift register. The first shift register includes a first plurality of stages connected one after another to each other to sequentially output a plurality of first gate signals. A first stage of the first shift register receives a vertical start signal. The second shift register includes a second plurality of stages connected one after another to each other to sequentially output a plurality of second gate signals. A first stage of the second shift register receives an output signal of the first stage of the first shift register as its vertical start signal.

Figure 3:
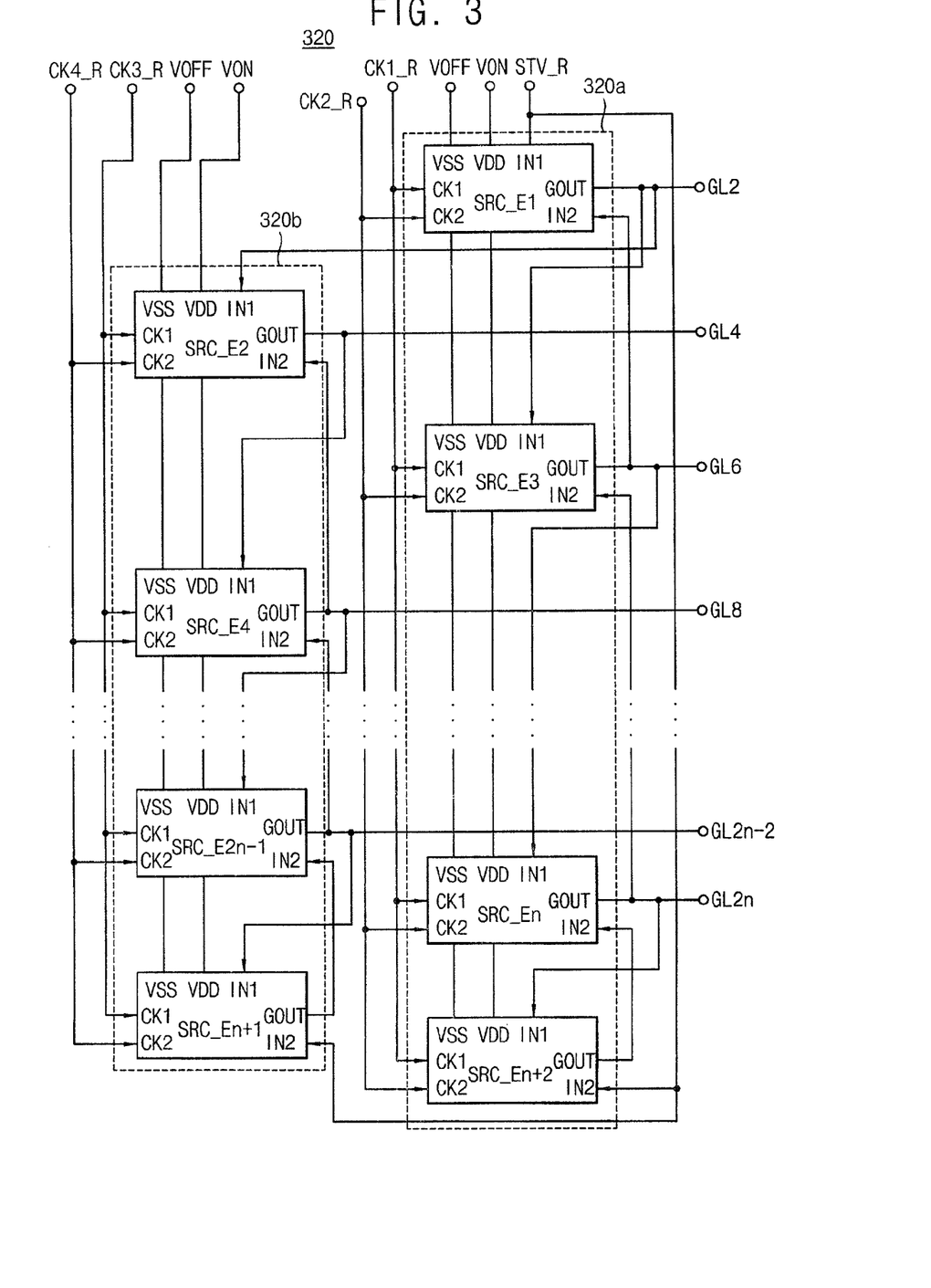
FIG. 3 is a block diagram of the second gate driving circuit 320 in FIG. 1.

In an exemplary embodiment of the present invention, the gate driving circuit may further include a third shift register (see 320a in FIG. 3) and a fourth shift register (see 320b in FIG. 3). The third shift register may include a third plurality of stages connected one after another to each other to sequentially output a plurality of third gate signals. The first stage of the third shift register may receive a second vertical start signal (STV_R) delayed by 1H ('H' is a horizontal period) with respect to the first (primary) vertical start signal (STV_L). The fourth shift register may include a fourth plurality of stages connected one after another to each other to sequentially output a plurality of fourth gate signals. Because the fourth shift register receives a third clock signal (CK3_R) and a fourth clock signal (CK4_R) that are different from the first clock signal (CK1_R) and the second clock signal (CK2_R) received by the first shift register, the first stage of the fourth shift register may receive the output signal of the first stage of the third shift register as its start signal (instead of receiving a second delayed vertical start signal equivalent to the second start signal (STV_R) being delayed by 2H ('H' is a horizontal period)). Because the first, second, third, and fourth clock signals (CK1_R, CK2_R, CK3_R, CK4_R) of the third and fourth shift registers are delayed by 1H ('H' is a horizontal period) with respect to the corresponding first, second, third, and fourth clock signals (CK1_L, CK2_L, CK3_L, CK4_L) of the first and second shift registers, the first and second shift registers may be configured to output all of the ODD gate signals (GL1, GL3, GL5, . . . ), while the third and fourth shift registers are configured to output all of the EVEN gate signals (GL2, GL4, GL6, . . . ).

In an exemplary embodiment of the present invention, each of the first to fourth gate signals may have a pulse width of 4H and may be sequentially delayed by 1H relative to each other.

The first and second stages may be connected to odd-numbered gate lines, and the third and fourth stages may be connected to even-numbered gate lines.

The display panel may include a pixel area on which the pixels are formed and a peripheral area which surrounds the pixel area. The first and second shift registers may be integrated on a first peripheral area corresponding to first terminals of the (odd) gate lines, and the third and fourth shift registers may be integrated on a second peripheral area corresponding to second terminals of the (even) gate lines.

In an exemplary embodiment of the present invention, the first shift register may receive a first clock signal and a second clock signal having a phase opposite to the first clock signal. The second shift register may receive a third clock signal delayed by 2H with respect to the first clock signal and a fourth clock signal having a phase opposite to the third clock signal. The third shift register may receive a fifth clock signal delayed by 1H with respect to the first clock signal and a sixth clock signal having a phase opposite to the fifth clock signal. The fourth shift register may receive a seventh clock signal delayed by 3H with respect to the first clock signal and an eighth clock signal having a phase opposite to the seventh clock signal.

According to exemplary embodiments of the present invention, a data charging rate may be improved by ensuring the timing margin of a gate signal, so that the driving reliability of the gate driving circuit may be improved.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of features, voltage levels, and regions may be exaggerated for clarity of illustration.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions and/or sections, these elements, components, regions and/or sections should not be limited by these terms. These terms are only used to distinguish one element, component, region or section from another region, layer or section. Thus, a first element, component, region or section discussed below could be termed a second element, component, region or section without departing from the teachings of the present invention.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise.

Exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF EXEMPLARY EMBODIMENTS OF THE INVENTION

Figure 1:
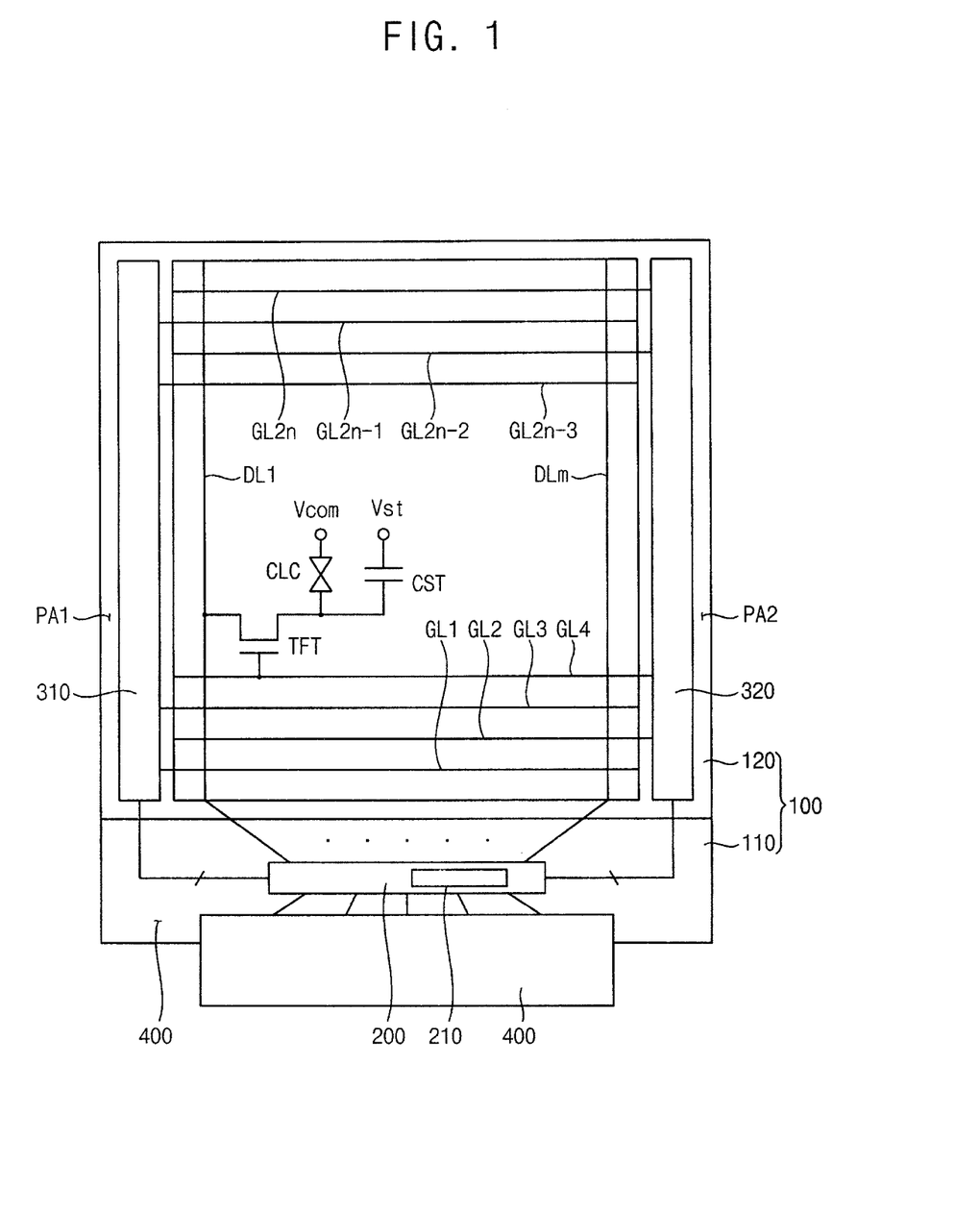
FIG. 1 is a plan view of a liquid crystal display (LCD) according to an exemplary embodiment of the present invention.

FIG. 1 is a plan view of a liquid crystal display (LCD) according to an exemplary embodiment of the present invention.

Referring to FIG. 1, a display device according to the present exemplary embodiment includes a display panel 100, a driving chip 200, a first gate driving circuit 310, a second gate driving circuit 320 and a printed circuit board (PCB) 400.

The display panel 100 may include a thin film transistor substrate (TFT) (display) substrate 110, an color filter substrate 120 opposite to the TFT substrate 110 and a liquid crystal layer (not shown) interposed between the TFT substrate 110 and the color filter substrate 120. The display panel 100 may include a display area DA which displays an image and a peripheral area PA which surrounds the display area DA.

A plurality of gate lines GL1 to GL2n ('n' is a natural number) and a plurality of data lines DL1 to DLm ('m' is a natural number) crossing the 2n gate lines GL1 to GL2n are formed on the TFT substrate 110 within the display area DA. A plurality of pixels is formed within the display area DA. Each of the pixels is electrically connected to one of the gate lines GL1 to GL2n and one of the data lines DL1 to DLm. Each of the pixels includes a thin-film transistor (TFT), a liquid crystal capacitor $C_{LC}$ and a storage capacitor $C_{ST}$.

The peripheral area PA includes a first peripheral area PA1, a second peripheral area PA2 and a third peripheral area PA3. The first peripheral area PA1 corresponds to the terminals of the odd gate lines GL1 to GL2n−1, the second peripheral area PA2 corresponds to terminals of the even gate lines GL2 to GL2n, and the third peripheral area PA3 corresponds to first terminals of the data lines DL1 to DLm.

The printed circuit board PCB 400 may be attached to a first side of the third peripheral area PA3. The PCB 400 electrically connects an external (host) device (not shown) to the driving chip 200, so that an image data signal and a control signal applied from the external device are transmitted to the driving chip 200. The PCB 400 may be a flexible PCB (FPCB).

The driving chip 200 may be mounted on the TFT substrate 110 within the third peripheral area PA3. The driving chip 200 may include a data driving part 210 and a gate driving part. The gate driving part of the driving chip 200 applies first and second gate control signals to the first and second gate driving circuits 320, respectively. The data driving part 210 of the driving chip 200 applies a data voltage to each of the data lines DL1 to DLm. The data driving part 210 converts the image data signal received from the external device into analog data voltages, and applies the analog data voltages to the data lines DL1 to DLm to cause the pixels to display the image.

The first gate driving circuit 310 may be integrated on the TFT substrate 110 within the first peripheral area PA1. The first gate driving circuit 310 is electrically connected to odd-numbered gate lines GL1, GL3, . . . , GL2n−1. The first gate driving circuit 310 sequentially outputs gate signals to the odd-numbered gate lines GL1, GL3, . . . , GL2n−1.

The second gate driving circuit 320 may be integrated on the TFT substrate 110 within the second peripheral area PA2. The second gate driving circuit 320 is electrically connected to even-numbered gate lines GL2, GL4, . . . , GL2n. The second gate driving circuit 320 sequentially outputs gate signals to the even-numbered gate lines GL2, GL4, . . . , GL2n.

FIG. 2 is a block diagram of a first gate driving circuit 310 of FIG. 1.

Referring to FIGS. 1 and 2, the first gate driving circuit 310 includes a first shift register 310a and a second shift register 310b. The first shift register 310a includes a plurality of first stages SRC_O1, SRC_O3, . . . , SCR_On+2 cascade-connected one after another to each other. The first stages SRC_O1, SRC_O3, . . . , SCR_On+2 includes n/2 first driving stages SRC_O1, SRC_O3, . . . , SRC_On plus a first dummy stage SRC_On+2.

The second shift register 310b includes a plurality of second stages SRC_O2, SRC_O4, . . . , SCR_On+1 cascade-connected one after another to each other. The second stages SRC_O2, SRC_O4, . . . , SCR_On+1 includes n/2 second driving stages SRC_O2, SRC_O4, . . . , SRC_On+1 plus a second dummy stage SRC_On+1.

The n first and second driving stages SRC_01 to SRC_On are electrically connected to the odd-numbered gate lines GL1, GL3, . . . , GL2n−1 and sequentially output a gate signal to the odd-numbered gate lines GL1, GL3, . . . , GL2n−1.

Each of the n+2 stages (e.g., SRC_01) of the first and second shift registers 310a and 310b includes a first clock terminal CK1, a second clock terminal CK2, a first input terminal IN1, a second input terminal IN2, a first power supply voltage terminal VDD, a second power supply voltage terminal VSS and an output terminal GOUT (e.g., GL1).

A first clock signal (e.g., CK1_L), a second clock signal (e.g., CK2_L), are applied to the first and second clock terminals CK1 and CK2 (e.g., in SRC_01). For example, the first clock signal CK1_L is applied to the first clock terminals CK1 of the first stages SRC_01, SRC_03, . . . , SRC_On+2, respectively. A second clock signal CK2_L having a phase opposite to the first clock signal CK1_L is applied to the second clock terminals CK2 of the first stages SRC_01, SRC_03, . . . , SRC_On+2, respectively. Meanwhile, the third clock signal CK3_L is applied to the first clock terminals CK1 of the second stages SRC_02, SRC_04, . . . , SRC_On+1, respectively. A fourth clock signal CK4_L having a phase opposite to the third clock signal CK3_L is applied to the second clock terminals CK2 of the second stages SRC_02, SRC_04, . . . , SRC_On+1, respectively. Here, the first to fourth clock signals CK1_L, CK2_L, CK3_L and CK4_L have a period of 4H (where 'H' is a horizontal period). The third clock signal CK3_L is a signal delayed by 2H with respect to the first clock signal CK1_L.

The first input terminal IN1 receives a first vertical start signal STV_L or an output signal of a previous stage. For example, the first vertical start signal STV_L applied from the driving chip 200 is applied to a first input terminal IN1 of a first stage SRC_O1 of the first shift register 310a because a previous stage does not exist for first stage SRC_O1. Meanwhile, the output signal of the first stage SRC_O1 of the first shift register 310a is applied to a first input terminal IN1 of a first stage SRC_02 of the second shift register 310b, and to the first input terminal IN1 of a second stage SRC_03 of the first shift register 310a. Output signals of first stages SRC_O1 and SRC_O2 are applied to first input terminals IN1 of the remaining stages SRC_03 to SCR_On+2 in the respective first shift register 310a and second shift register 310b.

The second input terminal IN2 receives an output signal fed back from a following stage (or the first vertical start signal STV_L). For example, the first vertical start signal STV_L is applied to second input terminals IN2 of the first and second dummy stages SRC_On+1 and SRC_On+2 for which a following stage does not exist.

A gate-ON voltage VON is applied to the first power voltage terminal VDD of every stage, and a gate-OFF (ground) voltage VOFF is applied to the second power supply (ground) voltage terminal VSS of every stage.

The n output terminals GOUT are one-to-one connected to the n odd-numbered gate lines GL1, GL3, ..., GL2n-1 to sequentially output gate signals to the n odd-numbered gate lines GL1, GL3, ..., GL2n-1. The output terminal GOUT of each stage is electrically connected to the first input terminal IN1 of a following stage to provide the first input terminal IN1 of the following stage with its output signal. The output terminal GOUT of each stage is electrically connected to the second input terminal IN2 of a previous stage to feedback the second input terminal IN2 of the previous stage with its output signal.

FIG. 3 is a block diagram of a second gate driving circuit 320 in FIG. 1.

Referring to FIGS. 1 and 3, the second gate driving circuit 320 includes a third shift register 320a and a fourth shift register 320b. The third shift register 320a includes a plurality of third stages SRC_E1, SRC_E3, ..., SCR_En+2 cascade-connected one after another to each other. The third stages SRC_E1, SRC_E3, ..., SCR_En+2 includes n/2 first driving stages SRC_E1, SRC_E3, ..., SRC_En plus one first dummy stage SRC_En+2.

The fourth shift register 320b includes a plurality of fourth stages SRC_E2, SRC_E4, ..., SCR_En+1 connected one after another to each other. The fourth stages SRC_E2, SRC_E4, ..., SCR_En+1 includes n/2 second driving stages SRC_E2, SRC_E4, ..., SRC_E2n-1 plus one second dummy stage SRC_En+1.

The first and second driving stages SRC_E1 to SRC_En are electrically connected to the even-numbered gate lines GL2, GL4, ..., GL2n, and sequentially output gate signals to the even-numbered gate lines GL2, GL4, ..., GL2n.

Each of the n+2 stages of the third and fourth shift registers 320a and 320b includes a first clock terminal CK1, a second clock terminal CK2, a first input terminal IN1, a second input terminal IN2, a first power supply voltage terminal VDD, a second power supply voltage terminal VSS and an output terminal GOUT.

In the first shift register 310a, each of the first and second clock terminals CK1 and CK2 receives a fifth clock signal CK1_R, and a sixth clock signal CK2_R. For example, the fifth clock signal CK1_R is applied to the first clock terminals CK1 of the third stages SRC_E1, SRC_E3, ..., SRC_En+2, respectively. A sixth clock signal CK2_R having a phase opposite to the fifth clock signal CK1_R is applied to the second clock terminals CK2 of the third stages SRC_E1, SRC_E3, ..., SRC_En+2, respectively. Meanwhile, a seventh clock signal CK3_R is applied to the first clock terminals CK1 of the fourth stages SRC_E2, SRC_E4, ..., SRC_En+1, respectively. An eighth clock signal CK4_R having a phase opposite to the seventh clock signal CK2_R is applied to the second clock terminals CK2 of the fourth stages SRC_E2, SRC_E4, ..., SRC_En+1, respectively. Here, the fifth to eighth clock signals CK1_R to CK4_R are inverted in a period of 4H (where 'H' is a horizontal period). The seventh clock signal CK3_R is a signal delayed by 2H with respect to the fifth clock signal CK1_R.

The first input terminal IN1 of each stage receives a second vertical start signal STV_R or an output signal of a previous stage. For example, the second vertical start signal STV_R applied from the driving chip 200 is applied to a first input terminal IN1 of a first stage SRC_E1 of the third shift register 320a for which a previous stage does not exist. And, an output signal of a first stage SRC_E1 of the third shift register 320a is applied to a first input terminal IN1 of a first stage SRC_E2 of the fourth shift register 320b and to the first input terminal IN1 of a second stage SRC_E3 of the third shift register 320a. Output signals of previous stages the third shift register 320a and the fourth shift register 320b are applied to first input terminals IN1 of the remaining stages SRC_E3 to SCR_En+2 in the respective third shift register 320a and fourth shift register 320b.

The second input terminal IN2 receives an output signal fed back from a following stage (or the second vertical start signal STV_R). For example, the second vertical start signal STV_O is applied to second input terminals IN2 of the first and second dummy stages SRC_En+1, and, SRC_En+2 for which a following stage does not exist.

A gate-ON voltage VON is applied to the first power supply voltage terminal VDD, and a ground voltage VOFF is applied to the second power supply (ground) voltage terminal VSS.

The n output terminals GOUT are one-to-one connected to the n odd-numbered gate lines GL1, GL3, ..., GL2n-1 to sequentially output gate signals to the n odd-numbered gate lines GL1, GL3, ..., GL2n-1 The output terminal GOUT of each stage is electrically connected to the first input terminal IN1 of the following stage to provide the first input terminal IN1 of the following stage with the output signal. The output terminal GOUT of each stage is electrically connected to the second input terminal IN2 of a previous stage to provide the second input terminal IN2 of the previous stage with its output signal.

Figure 4:
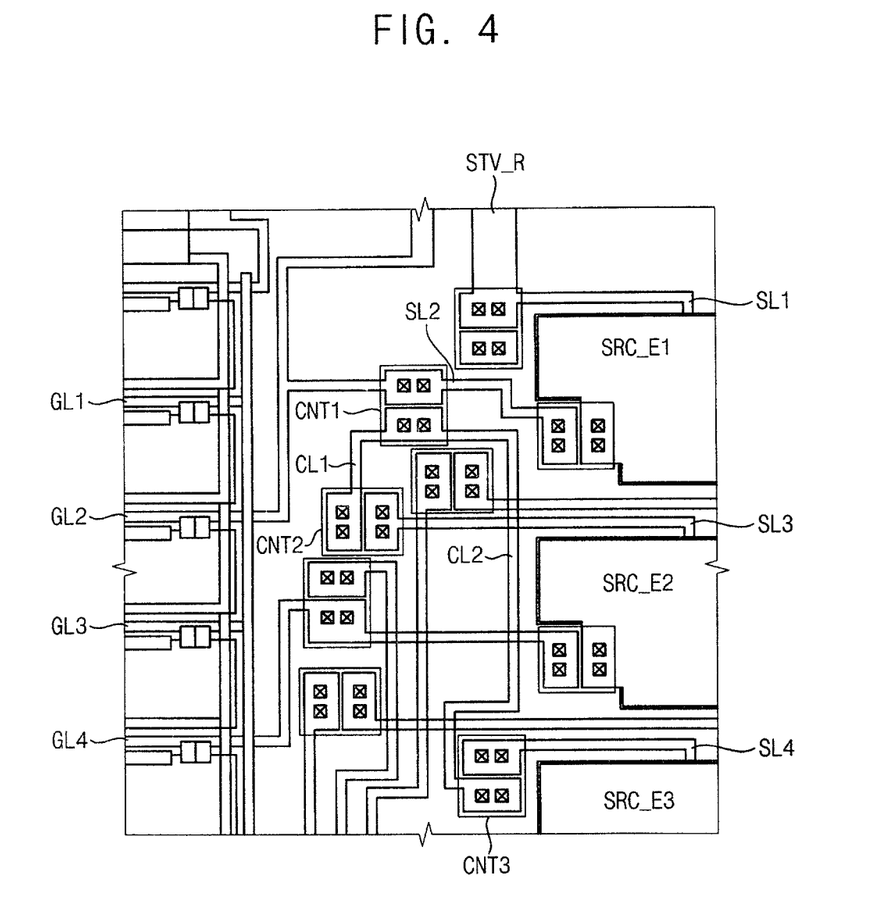
FIG. 4 is a layout illustrating an integrated circuit implementing a portion of the second gate driving circuit 320 of FIG. 3.

FIG. 4 is a layout illustrating an integrated circuit implementing a portion of the second gate driving circuit 320 of FIG. 3.

Referring to FIGS. 3 and 4, the portion of the second gate driving circuit 320 illustrated in FIG. 4 includes stages SRC_E1, SRC_E2, SRC_E3 connected to the even-numbered gate lines G2 and G4 (and GL6, not shown).

A first stage SRC_E1 of the third shift register 320a receives the second vertical start signal STV_R through a first signal line SL1. An output signal G2 of the first stage SRC_E1 is applied to the second gate line GL2 through a second signal line SL2. Moreover, the output signal G2 of the first stage SRC_E1 is applied to a first input terminal IN1 of a first stage SRC_E2 of a fourth shift register 320b through the second signal line SL2 and a third signal line SL3. The second signal line SL2 and the third signal line SL3 are electrically connected to each other through a first connecting line CL1. The first connecting line CL1 is electrically connected to the second signal line SL2 through a first contact portion CNT1, and electrically connected to the third signal line SL3 through a second contact portion CNT2.

The output signal G2 of the first stage SRC_E1 is applied to a first input terminal IN1 of a second stage SRC_E3 through the second signal line SL2 and a fourth signal line SL4. The second signal line SL2 and the fourth signal line SL4 are electrically connected to each other through a second connecting line CL2. The second connecting line CL2 is electrically connected to the second signal line SL2 through the first contact portion CNT1, and is electrically connected to the fourth signal line SL4 through a third contact portion CNT3.

The first to fourth signal lines SL1 to SL4 may be formed of a first conductive layer formed on the TFT substrate 110, and the first and second connecting line CL1 and CL2 may be formed of a second conductive layer formed on the TFT substrate 110. A contact electrode of the contact portions CNT1 to CNT3 may be formed of a third conductive layer formed on the TFT substrate 110. The first to fourth signal lines SL1, SL2, SL3, and SL4 may be formed from a TFT gate metal, and the first and second connecting lines CL1 and CL2 may be formed from a data metal. The contact electrode may be formed from a material identical to a pixel electrode formed in the pixel. Thus, the contact electrode may be formed from a transparent metal.

Figure 5:
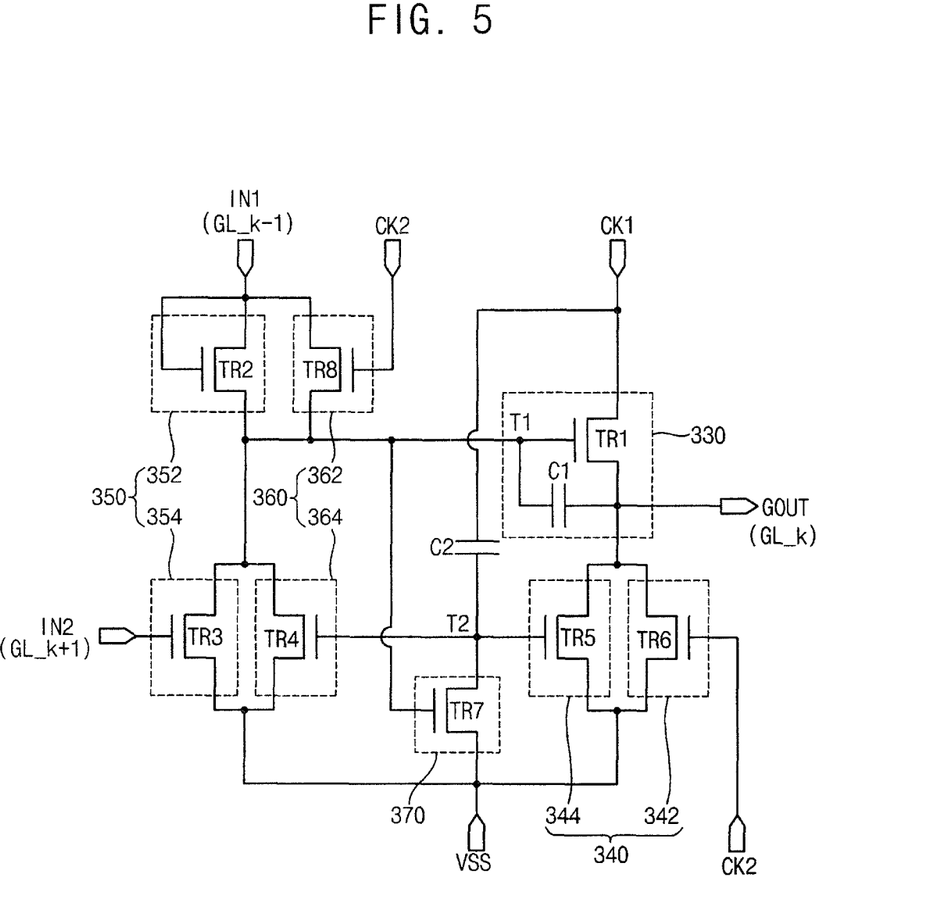
FIG. 5 is a circuit diagram of one stage in the gate driving circuits 310 and 320 of FIGS. 2 and 3.

FIG. 5 is a circuit diagram of one stage in the gate driving circuits 310 and 320 of FIGS. 2 and 3.

Hereinafter, for convenience of description, a representative k-th stage SRC_k (e.g., the first stage of the first shift register 310a) driven by receiving a first and second clock signals CK1_L and CK2_L through a first and second clock terminals CK1 and CK2, respectively, in a k-th stage of the first gate driving circuit 310 will be described. In the present exemplary embodiment, the first clock signal CK1_L has a phase opposite to the second clock signal CK2_L.

Referring to FIG. 5, each of the stages includes a pull-up part 330, a pull-down part 340, a pull-up driving part 350, a ripple preventing part 360, a switch holding capacitor C2 and a pull-down driving part 370.

The pull-up part 330 outputs a first clock signal CK1_L applied to a first clock terminal CK1 to an output terminal GOUT as a gate driving signal. The pull-up part 330 includes a first field effect transistor (FET) TR1 having an input (source) electrode, an output (drain) electrode, and a control (gate) electrode. The input (source) electrode of first transistor TR1 is connected to the first clock terminal CK1. The output (drain) electrode of first transistor TR1 is connected to the output terminal GOUT. The control (gate) electrode of first transistor TR1 is connected to a first (pull-up) node T1.

The pull-up part 330 further includes a charge storing capacitor C1 formed between the control electrode and the output electrode of the first transistor TR1. The charge storing capacitor C1 stores a first input signal applied to a first input terminal IN1 to turn-on the first transistor TR1. In this case, the first input signal is a (k−1)-th gate signal (GOUT, GLk−1), from a corresponding (k−1)-th stage SRC_k−1, input to the first input terminal IN 1 of the (k)-th stage SRC_k. In a first stage SRC_1, the first input signal is a first vertical start signal STV_L or a second vertical start signal STV_R.

The pull-down part 340 includes a first pull-down unit 342 and a second pull-down unit 344.

The first pull-down unit 342 discharges a gate signal output to the output terminal GOUT in response to the second clock signal CK2_L applied to a second clock terminal CK2. The second pull-down unit 344 discharges the gate signal output to the output terminal GOUT in response to the first clock signal CK1_L applied to a first clock terminal CK1.

The first pull-down unit 342 includes a sixth transistor TR6 having an input electrode, a control (gate) electrode and output electrode. The input electrode of sixth transistor TR6 is connected to a power supply (ground) voltage terminal VSS. The control (gate) electrode of sixth transistor TR6 is connected to a third clock terminal CK3. The output electrode of sixth transistor TR6 is connected to the output terminal GOUT.

The second pull-down unit 344 includes a fifth transistor TR5 having an input electrode, a control (gate) electrode and output electrode. The input electrode of fifth transistor TR5 is connected to a power supply (ground) voltage terminal VSS. The control (gate) electrode of fifth transistor TR5 is connected to the switch holding capacitor C2 at a second (pull-down) node T2. The output electrode of fifth transistor TR5 is connected to the output terminal GOUT.

A first clock signal CK1_L for turning ON/OFF the second pull-down unit 344 is a signal that charges and discharges the switch holding capacitor C2.

The pull-up driving part 350 includes a first pull-up driving unit 352 and a second pull-up driving unit 354.

The pull-up driving part 350 turns ON the pull-up part 330 in response to a high level of first input signal applied to the first input terminal IN1. The pull-up driving part 350 turns OFF the pull-up part 330 in response to a high level of second input signal applied to the second input terminal IN2. Here, the first input signal may be a gate signal of a previous (k−1)-th stage SRC_k−1, and the second input signal may be a gate signal feed back from a following (k+1)-th stage SRC_k+1.

The first pull-up driving unit 354 includes a second transistor TR2 having an input electrode, an output electrode and a control (gate) electrode. The input electrode and control electrode of second transistor TR2 are connected to the first input terminal IN1. The output electrode of second transistor TR2 is connected to the first (pull-up) node T1.

The second pull-up driving unit 354 includes a third transistor TR3 having an input electrode, an output electrode and a control (gate) electrode. The input electrode of third transistor TR3 is connected to the power supply (ground) voltage terminal VSS. The output electrode of third transistor TR3 is connected to the first (pull-up) node T1. The control (gate) electrode of third transistor TR3 is connected to a second input terminal IN2.

In the pull-up driving part 350, when the second transistor TR2 is turned ON in response to a high level of the first input signal (a high value of the (k−1)-th gate signal GOUTk−1, GLk−1) applied to the first input terminal IN1, the first input signal is applied to the first (pull-up) node T1 so that the charge storing capacitor C1 is charged. When electric charges greater than the threshold voltage of the first transistor TR1 are charged into the charge storing capacitor C1, first transistor TR1 is turned ON so that the first clock signal CK1_L of a high level as applied to the output terminal GOUT, and the control gate of the first transistor TR1 is bootstrapped and held high by charge storing capacitor C1 so that a high level of the first clock signal CK1_L is output through the output terminal GOUT, e.g., until the electric charge charged in the charge storing capacitor C1 is discharged.

Then, when the eighth transistor TR8 is turned ON in response to a high level of the second input signal (a gate signal GL_k+1 fed back from a following (k+1)-th stage SRC_k+1) applied to the second input terminal IN2, electric charge charged in the charge storing capacitor C1 is discharged. Upon discharging of the charge storing capacitor C 1, the first (pull-up) node T1 falls to a low level and the first transistor TR1 is turned OFF, so that an outputting of the first clock signal CK1_L is stopped.

When the first transistor TR1 is turned ON and the sixth transistor TR6 is turned ON in response to a high level of a second clock signal CK2_L applied to the third clock terminal CK3, the signal output by the output terminal GOUT is an off voltage (VSS) so that a gate-OFF signal is output. Moreover, the fifth transistor TR5 is turned ON in response to a high level of the first clock signal CK1_L charged in the switch holding capacitor C2, and then a signal output to the output terminal GOUT is maintained at a low level (VSS). Thus, the fifth transistor TR5 and the sixth transistor TR6 are alternatively turned ON to pull down the signal output at the output terminal GOUT.

The ripple preventing part 360 includes a first ripple preventing unit 362 and a second ripple preventing unit 364.

The first ripple preventing unit 362 includes an eighth transistor TR8 having an input electrode connected to the first input terminal IN1, an output electrode connected to the first (pull-up) node T1, and a control electrode connected to the second clock terminal CK2.

The second ripple preventing unit 364 includes a fourth transistor TR4 having an input electrode connected to the power voltage terminal VSS, a control (gate) electrode connected to the switch holding capacitor C2, and an output electrode connected to the first (pull-up) node T1.

A ripple of the first (pull-up) node T1 is generated by a parasitic capacitance between an input electrode and a control electrode of the first transistor TR1. The ripple preventing part 360 brings the voltage of the first (pull-up) node T1 down to a low level, to prevent ripples that may be generated at the first (pull-up) node T1 by coupling of the first clock signal CK1_L.

When the eighth transistor TR8 is turned ON in response to a high level of the second clock signal CK2_L applied to a second clock terminal CK2, the ripple preventing part 360 applies a low level of the first input signal applied to the first input terminal IN1 to the first (pull-up) node T1. Accordingly, the voltage of the first (pull-up) node T1 has been maintained at a low level. Moreover, when the fourth transistor TR4 is turned ON in response to a high level of the first clock signal CK1_L applied to a first clock terminal CK1 charged into the switch holding capacitor C2, an OFF voltage of the power voltage terminal VSS is applied to the first (pull-up) node T1 so that the voltage of the first (pull-up) node T1 maintains at a low level. The eighth transistor TR8 and the fourth transistor TR4 are alternately turned ON for a 1H interval so that the voltage of the first (pull-up) node T1 is maintained at a low level, and ripples that are generated at the first (pull-up) node T1 may be prevented.

A first electrode of the switch holding capacitor C2 is connected to the first clock terminal CK1, and a second electrode of the switch holding capacitor C2 is connected to the second (pull-down) node T2. A first clock signal CK1_L applied to the first clock terminal CK1 is input to be stored in the switch holding capacitor C2. The first clock signal CK1_L stored in the switch holding capacitor C2 is applied to the second (pull-down) node T2 to turn ON/OFF the fourth and fifth transistors TR4 and TR5.

The pull-down driving part 370 includes a seventh transistor TR7 having an input electrode connected to the power voltage terminal VSS, an output electrode connected to the second (pull-down) node T2 and a control (gate) electrode connected to the first (pull-up) node T1. The pull-down driving part 370 responds to a signal applied to the first (pull-up) node T1, and converts a voltage of the second (pull-down) node T2 into a low level. In a period where a voltage of high level is applied to the first (pull-up) node T1 so that the pull-up part 330 is driven, the second ripple preventing unit 364 and the pull-down part 340 are turned OFF in independent of the first clock signal CK1_L.

According to the present exemplary embodiment, each of the first and second ripple preventing units 362 and 364 responds to the first and second clock signal CK2_L so that a voltage of the first (pull-up) node T1 is stably maintained at a low level to prevent ripples.

Figure 6:
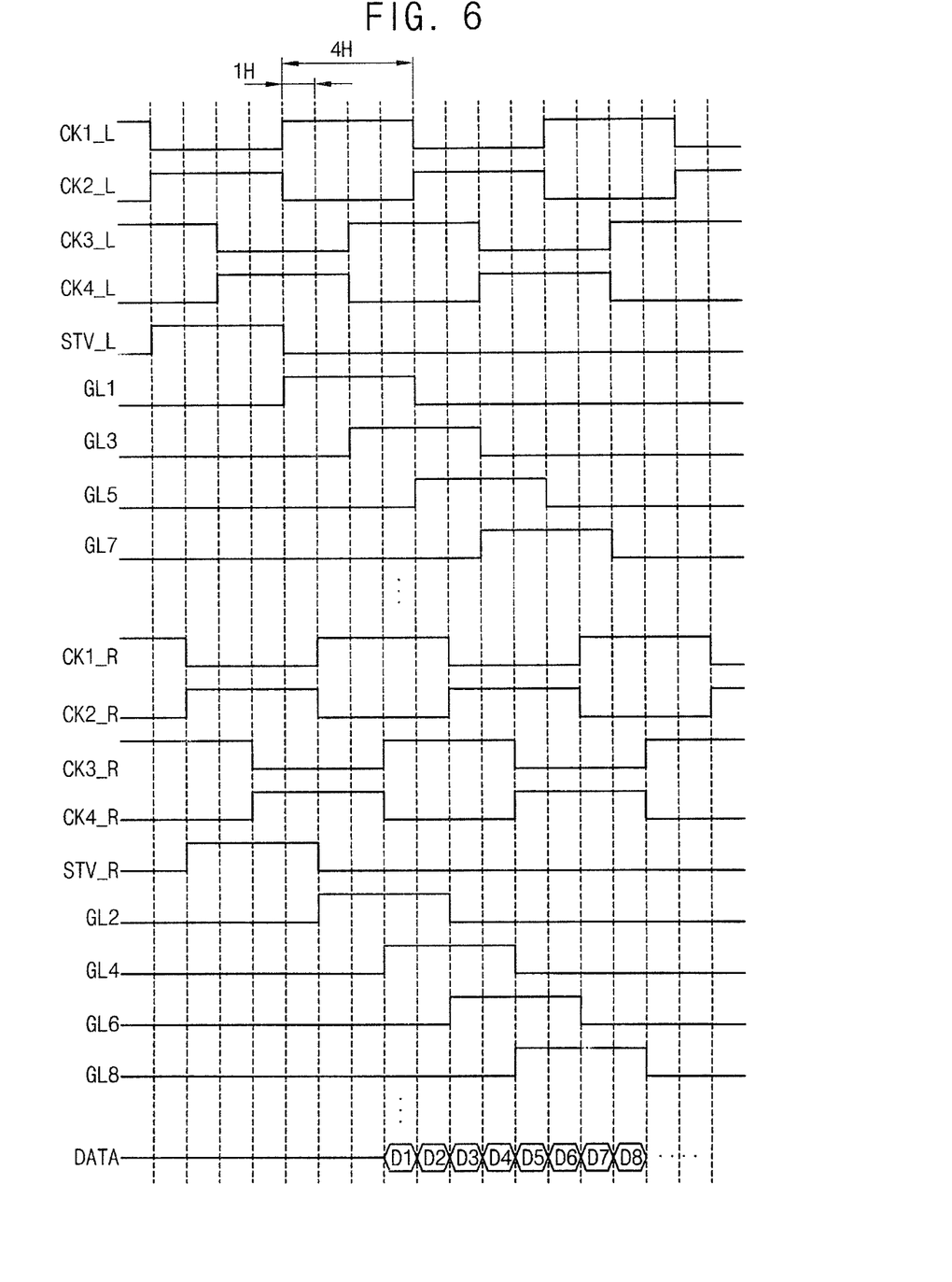
FIG. 6 is a timing diagram illustrating the timing of input signals and the output signals of the first and second gate driving circuits 310 and 320 as shown in FIGS. 2 and 3.

FIG. 6 is a timing diagram illustrating the timing of an input signals and the output signals of the first and second gate driving circuits 310 and 320 as shown in FIGS. 2 and 3.

Referring to FIGS. 2, 3 and 6, the first gate driving circuit 310 sequentially output gate signals to the odd-numbered gate lines GL1, GL3, . . . , GL2n−1 based on the first to fourth clock signals CK1_L to CK4_L. For example, the first shift register 310a sequentially outputs the gate signals based on the first and second clock signals CK1_L and CK2_L.

Referring to FIG. 2, a first stage SRC_O1 of the first shift register 310a outputs the gate signal in response to a high level of the first vertical start signal STV_L. The remaining stages SRC_O3, . . . , SRC_On+1 excluding the first stage SRC_O1 output their gate signals in response to a high level of an output signal (gate signal) of a previous stage. A pulse width of the first vertical start signal STV_L may be 4H.

The second shift register 310b sequentially outputs the gate signals based on the third and fourth clock signal CK3_L and CK4_L having opposite phases. A first stage SRC_O2 of the second shift register 310b outputs the gate signal in response to a high level of an output signal of the first stage SRC_O1 of the first shift register 310a. The remaining stages SRC_O4, . . . , SRC_On+1 output their gate signals in response to a high level of an output signal of a previous stage. The third clock signal CK3_L is a signal delayed by 2H with respect to the first clock signal CK1_L.

Referring to FIG. 3, the second gate driving circuit 320 sequentially outputs gate signals to the even-numbered gate lines GL2, GL4, . . . , GL2n based on the fifth to eighth clock signals CK1_R to CK4_R.

For example, the third shift register 320a sequentially outputs the gate signals based on the fifth and sixth clock signals CK1_R and CK2_R. A first stage SRC_E1 of the third shift register 320an outputs the gate signal in response to a high level of the second vertical start signal STV_R. The remaining stages SRC_E3, . . . , SRC_En+1 excluding the first stage SRC_E1 outputs their gate signals in response to a high level of an output signal of a previous stage. The second vertical start signal STV_R has a pulse width of 4H. The second vertical start signal STV_R is a signal delayed by 1H with respect to the first vertical start signal STV_L. The fifth clock signal CK1_R is a signal delayed by 1H with respect to the first clock signal CK1_L. The sixth clock signal CK2_R has a phase opposite to that of the fifth clock signal CK1_R.

The fourth shift register 320b sequentially outputs gate signals based on the seventh and eighth clock signals CK3_R and CK4_R. A first stage SRC_E2 of the fourth shift register 320b outputs the gate signal in response to a high level of an output signal of the first stage SRC_E1. The remaining stages SRC_E4, . . . , SRC_En+1 output their gate signals in response to a high level of an output signal of a previous stage. The seventh clock signal CK3_R is a signal delayed by 3H with respect to the first clock signal CK1_L. The eighth clock signal CK4_R is a signal having an opposite phase to the seventh clock signal CK3_R.

A first stage SRC_O1 of the first shift register 310a outputs a high level of the first clock signal CK1_L as a gate signal to a first gate line GL1 in response to the first vertical start signal STV_L. Then, a first stage SRC_E1 of the third shift register 320a outputs a high level of the fifth clock signal CK1_R as a gate signal to a second gate line GL2 in response to the second vertical start signal STV_R.

A first stage SRC_O2 of the second shift register 310b outputs a high level of the third clock signal CK3_L as a gate signal to a third gate line GL3 in response to an output signal of the first stage SRC_O1 of the first shift register 310a. Then, a first stage SRC_E2 of the fourth shift register 320b outputs a high level of the seventh clock signal CK3_R as a gate signal to a fourth gate line GL4 in response to an output signal of the first stage SRC_E1 of the third shift register 320a. Accordingly, the gate signals having a pulse width of 4H are sequentially delayed by 1H to be applied to the gate lines GL1 to GL2n.

A data voltage is output to data lines DL1 to DLm in synchronization with the gate signals. The data voltage is output in synchronization with a last 1H period of the 4H-wide gate signals. Here, an initial 3H interval of each gate signal may be defined as a precharging interval of a data voltage. Accordingly, a charging rate may be improved by the precharging during the precharging interval.

As described above, according embodiments of the present invention, the timing margin may be ensured through a four-division driving of a gate signal to improve a data charging rate, so that driving reliability may be improved. Moreover, as the voltage of a control electrode of pull-up part is stably maintained at a low level, the generation of ripples at a control electrode of the pull-up part may be prevented, so that noise defects of the gate signal may be removed. Thus, the reliability of the gate signal being an output signal of a gate driving circuit may be improved.

The foregoing exemplary embodiments are illustrative of the present invention and is not to be construed as limiting thereof. Although exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. The present invention is defined by the following claims, with equivalents of the claims to be included therein.

What is claimed is:

1. A gate driving circuit comprising:
a first shift register having a first plurality of cascade-connected stages configured to sequentially output a plurality of first gate signals, each stage having a forward-input terminal and an output terminal, and receiving a first vertical start signal as its start signal at the forward-input terminal its first stage, and outputting the first gate signals based on its received start signal and a received first clock signal and a received second clock signal; and
a second shift register having a second plurality of cascade-connected stages configured to sequentially output a plurality of second gate signals, each stage having a forward-input terminal and an output terminal, and outputting the second gate signals based on its received start signal and a received third clock signal and a received fourth clock signal,
wherein the received start signal of the second shift register is delayed with respect to the received start signal of the first shift register,
wherein the received second clock signal has a phase opposite to the received first clock signal, and
wherein the received third clock signal is delayed by 2H with respect to the received first clock signal and the received fourth clock signal has a phase opposite to the received third clock signal.

2. The gate driving circuit of claim 1:
wherein the forward-input of the first stage of the second shift register receives the gate signal output by the first stage of the first shift register as the start signal of the second shift register.

3. The gate driving circuit of claim 1, wherein the gate signal output by the first stage of the second shift register is delayed by 2H, wherein 'H' is a horizontal period, with respect to the gate signal output by the first stage of the first shift register.

4. The gate driving circuit of claim 1, wherein each of the stages comprises:
a pull-up part having a control electrode and outputting a clock signal, as its gate signal, to its output terminal while enabled;
a first pull-up driving unit configured to disable the pull-up part in response to an output signal of a following stage;
a first pull-down unit pulling down the voltage of the output terminal to a low level in response to a high level of an inverted clock signal having a phase opposite that of the clock signal; and
a first ripple preventing unit maintaining a voltage applied to the control electrode of the pull-up part to a low level in response to a high level of the inverted clock signal.

5. The gate driving circuit of claim 4, wherein a period of the clock signal is 8H and the duty ratio of the clock signal is 0.5.

6. The gate driving circuit of claim 4, wherein first pull-up driving unit in the last stage of the second shift register disables the pull-up part thereof in response to the first vertical start signal.

7. The gate driving circuit of claim 4, wherein each of the stages further comprises:
a switch holding capacitor storing the clock signal;
a second pull-down unit pulling down the voltage of its output terminal at a low level in response to the clock signal stored in the switch holding capacitor; and
a second ripple preventing unit maintaining the voltage of its output terminal at a low level in response to a high level of the clock signal.

8. The gate driving circuit of claim 7, wherein each of the stages further comprises:
a feedback-input terminal;
a second pull-up driving unit enabling the pull-up part in response to the signal received at its forward-input terminal or the output signal of the previous stage received at its feedback-input terminal; and
a pull-down driving part turning off the second pull-down driving unit and the ripple preventing part in response to a signal applied to the control electrode of the pull-up part.

9. The gate driving circuit of claim 1, further comprising:
a third shift register having a third plurality of cascade-connected stages configured to sequentially output a plurality of third gate signals, each stage having a forward-input terminal and an output terminal, and receiving a second vertical start signal as its start signal at the forward-input terminal its first stage, and outputting the third gate signals based on its received start signal and a received first clock signal and a received second clock signal; and
a fourth shift register having a fourth plurality of cascade-connected stages configured to sequentially output a plurality of fourth gate signals, each stage having a forward-input terminal and an output terminal, and outputting the fourth gate signals based on its received start signal and a received third clock signal and a received fourth clock signal.

10. The gate driving circuit of claim 9,
wherein the received start signal of the fourth shift register is delayed with respect to the received start signal of the third shift register,
wherein the second clock signal received by the third shift register has a phase opposite to the first clock signal received by the third shift register,
wherein the third clock signal received by the fourth shift register is delayed by 2H with respect to the first clock signal received by the third shift register and the fourth clock signal received by the fourth shift register has a phase opposite to the third clock signal received by the fourth shift register.

11. The gate driving circuit of claim 10,
wherein the first and second clock signals received by the third shift register are both delayed by 1H with respect to the corresponding first and second clock signals received by the first shift register,
wherein the third and fourth clock signals received by the fourth shift register are both delayed by 1H with respect to the corresponding third and fourth clock signals received by the second shift register.

12. The gate driving circuit of claim 9,
wherein the output terminals of stages in the first and second shift registers are connected only to odd-numbered gate lines, and
wherein the output terminals of stages in the third and fourth shift registers are connected only to even-numbered gate lines.

13. The gate driving circuit of claim 9, wherein the second vertical start signal is delayed by 4H, wherein 'H' is a horizontal period, with respect to the first vertical start signal.

14. The gate driving circuit of claim 9, wherein the plurality of first gate signals and the plurality of second gate signals constitute the ODD-numbered gate signals of the gate driving circuit, but do not include the EVEN-numbered gate signals of the gate driving circuit.

15. The gate driving circuit of claim 9,
wherein the forward-input terminal of the first stage of the second shift register receives the gate signal output by the first stage of the first shift register as the start signal of the second shift register, and
wherein the forward-input terminal of the first stage of the fourth shift register receives the gate signal output by the first stage of the third shift register as the start signal of the fourth shift register.

16. A display device comprising:
a display panel including a plurality of pixels connected to a plurality of gate lines and a plurality of data lines crossing to each other;
a data driving circuit outputting a plurality of data signals to the data lines; and
a gate driving circuit sequentially outputting of gate signals, the gate driving circuit comprising:
a first shift register having a first plurality of cascade-connected stages to sequentially output a plurality of first gate signals, the first stage of the first shift register receiving a first vertical start signal as the start signal of the first shift register; and
a second shift register having a second plurality of cascade-connected stages configured to sequentially output a plurality of second gate signals, the first stage of the second shift register receiving the start signal of the second shift register,
wherein the first shift register receives a first clock signal and a second clock signal having a phase opposite to the first clock signal, and
wherein the second shift register receives a third clock signal delayed by 2H with respect to the first clock signal and a fourth clock signal having a phase opposite to the third clock signal.

17. The display device of claim 16, wherein each stage has a forward-input terminal and an output terminal,
the forward input of the first stage of the second shift register receives the gate signal output by the first stage of the first shift register as the start signal of the second shift register.

18. The display device of claim 16, wherein the gate driving circuit further comprises:
a third shift register having a third plurality of cascade-connected stages configured to sequentially output a plurality of third gate signals, each stage having a forward-input terminal and an output terminal, the forward-input terminal of the first stage of the third shift register receiving a second vertical start signal delayed by 1H ('H' is a horizontal period) with respect to the first vertical start signal; and
a fourth shift register having a fourth plurality of cascade-connected stages configured to sequentially output a plurality of fourth gate signals, each stage having a forward-input terminal and an output terminal, the forward-input terminal of the first stage of the fourth shift register receiving the gate signal output by the output terminal of the first stage of the third shift register as the start signal of the fourth shift register.

19. The display device of claim 18, wherein each of the first gate signals has a pulse width of 4H and each one of the first gate signals is sequentially delayed by 4H relative to a previous one of the first gate signals.

20. The display device of claim 18, wherein the first gate signal of the plurality of second gate signals is delayed by 2H relative to the first gate signal of the plurality of first gate signals.

21. The display device of claim 18, wherein the output terminals of stages in the first and second shift registers are connected only to odd-numbered gate lines, and the output terminals of stages in the third and fourth shift registers are connected only to even-numbered gate lines.

22. The display device of claim 21, wherein the display panel comprises:
a pixel area on which the pixels are formed, and
a first peripheral area adjacent to the pixel area and including terminals of the odd gate lines, and
a second peripheral area adjacent to the pixel area and including terminals of the even gate lines,
wherein the first and second shift registers are integrated on the first peripheral area, and
wherein the third and fourth shift registers are integrated on a second peripheral area.

23. The display device of claim 18, wherein each of the stage comprises:
a pull-up part outputting a clock signal as a gate signal to its output terminal in response to a start signal or an output signal of a previous stage;
a first pull-up driving unit turning off the pull-up part in response to an output signal of a following stage;
a first pull-down unit pulling down a voltage of the output terminal to a low level in response to a high level of an inverted clock signal having a phase opposite to the clock signal; and
a first ripple preventing unit maintaining a voltage applied to a control electrode of the pull-up part to a low level in response to a high level of the inverted clock signal.

24. The display device of claim 23, wherein the pull-up driving unit in last stage of the second shift registers, turns off the pull-up part thereof in response to the first vertical start signal.

25. The display device of claim 23, wherein each of the stages further comprises:
a switch holding capacitor charging the clock signal;

a second pull-down unit pulling down a voltage of the output terminal to a low level in response to the clock signal charged in the switch holding capacitor; and a second ripple preventing unit maintaining a voltage of the output terminal to a low level in response to a high level of the clock signal.

26. The display device of claim 25, wherein each of the stage further comprises:

a second pull-up driving unit turning on the pull-up part in response to the its start signal or the output signal of the previous stage; and a pull-down driving part turning off the second pull-down driving unit and the ripple preventing part in response to a signal applied to the control electrode of the pull-up part.

27. The display device of claim 18, wherein the third shift register receives a fifth clock signal delayed by 1H with respect to the first clock signal and a sixth clock signal having a phase opposite to the fifth clock signal, and wherein the fourth shift register receives a seventh clock signal delayed by 3H with respect to the first clock signal and an eighth clock signal having a phase opposite to the seventh clock signal.

28. A gate driving circuit, operating in response to a first vertical start signal, comprising:

a first shift register having a first plurality of cascade-connected stages configured to sequentially output a plurality of first gate signals;

a second shift register having a second plurality of cascade-connected stages configured to sequentially output a plurality of second gate signals;

a third shift register having a third plurality of cascade-connected stages configured to sequentially output a plurality of third gate signals; and a fourth shift register having a fourth plurality of cascade-connected stages configured to sequentially output a plurality of fourth gate signals, wherein the first and second gate signals are output to odd-numbered gate lines, and wherein the third and fourth gate signals are output to even-numbered gate lines.

* * * * *